(12) United States Patent
Kawaguchi (10) Patent No.: US 6,521,841 B2
(45) Date of Patent: Feb. 18, 2003

(54) TEST COUPON IN PRINTED WIRING BOARD

(75) Inventor: Katsuo Kawaguchi, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/843,732

(22) Filed: Apr. 30, 2001

(65) Prior Publication Data

US 2002/0011857 A1 Jan. 31, 2002

Related U.S. Application Data

(63) Continuation of application No. PCT/JP99/06014, filed on Oct. 28, 1999.

(30) Foreign Application Priority Data

Oct. 30, 1998 (JP) ............................................ 10-310592

(51) Int. Cl.$^7$ ................................................ H05K 1/00
(52) U.S. Cl. ........................ 174/250; 174/261; 324/555
(58) Field of Search ................................ 174/250, 255, 174/261, 262–266; 324/537, 543, 555

(56) References Cited

U.S. PATENT DOCUMENTS 5,701,667 A * 12/1997 Birch et al. .................... 29/852
6,297,458 B1 * 10/2001 McMillan et al. .......... 174/250

* cited by examiner

Primary Examiner—Kamand Cuneo
Assistant Examiner—Jeremy Norris
(74) Attorney, Agent, or Firm—Oblon, Spivak, McClelland, Maier & Neustadt, P.C.

(57) ABSTRACT

A test coupon is used to evaluate characteristics of multi-layer printed wiring boards. The coupon includes a multi-layer substrate which has at least first and second wiring layers. The first and second wiring layers are configured to correspond to a tested wiring layer and another wiring layer of the multi-layer printed wiring boards, respectively. Each of first and second through hole groups has a plurality of through holes which pass through the multi-layer substrate and which are arranged in an arranging direction. A first and second conductor patterns which are provided on the first and second wiring layers respectively extend substantially along the arranging direction.

2 Claims, 9 Drawing Sheets

FIG.6 (a) EIGHT LAYER

FIG.6 (b) TENTH LAYER

FIG.6 (c) SECOND, FIFTH, SIXTH, AND NINTH LAYER

FIG. 7

FIG. 8 h: INTERLAYER THICKNESS
ω: CONDUCTOR PATTERN WIDTH
t: CONDUCTOR PATTERN THICKNESS
$\varepsilon_r$: DIELECTRIC CONSTANT
Z0: CHARACTERISTIC IMPEDANCE

*FIG. 9*

H, $h_1$, $h_2$: INTERLAYER THICKNESS
ω: CONDUCTOR PATTERN WIDTH
t: CONDUCTOR PATTERN THICKNESS
$\varepsilon_r$: DIELECTRIC CONSTANT
Z0: CHARACTERISTIC IMPEDANCE

*FIG. 10*

H: INTERLAYER THICKNESS
S/2: DISTANCE OF CONDUCTOR FROM THE MIDDLE OF LAYERS
ω: CONDUCTOR PATTERN WIDTH
t: CONDUCTOR PATTERN THICKNESS
$\varepsilon_r$: DIELECTRIC CONSTANT
Z0: CHARACTERISTIC IMPEDANCE

TEST COUPON IN PRINTED WIRING BOARD

CROSS-REFERENCE TO RELATED APPLICATION

The present application claims priority under 35 U.S.C. §119 to Japanese Patent Application No.10-310592, filed Oct. 30, 1998. Further, the present application is a continuation under 35 U.S.C. §120 to International Application No. PCT/JP99/06014, filed Oct. 28, 1999, entitled "TEST COUPON IN PRINTED WIRING BOARD." The contents of these applications are incorporated herein by reference in their entirety.

BACKGROUND OF THE INVENTION

1. Field of the Invention

The present invention relates to a test coupon which is configured to be used to evaluate characteristics of multi-layer printed wiring boards.

2. Discussion of the Background

Figure 14:
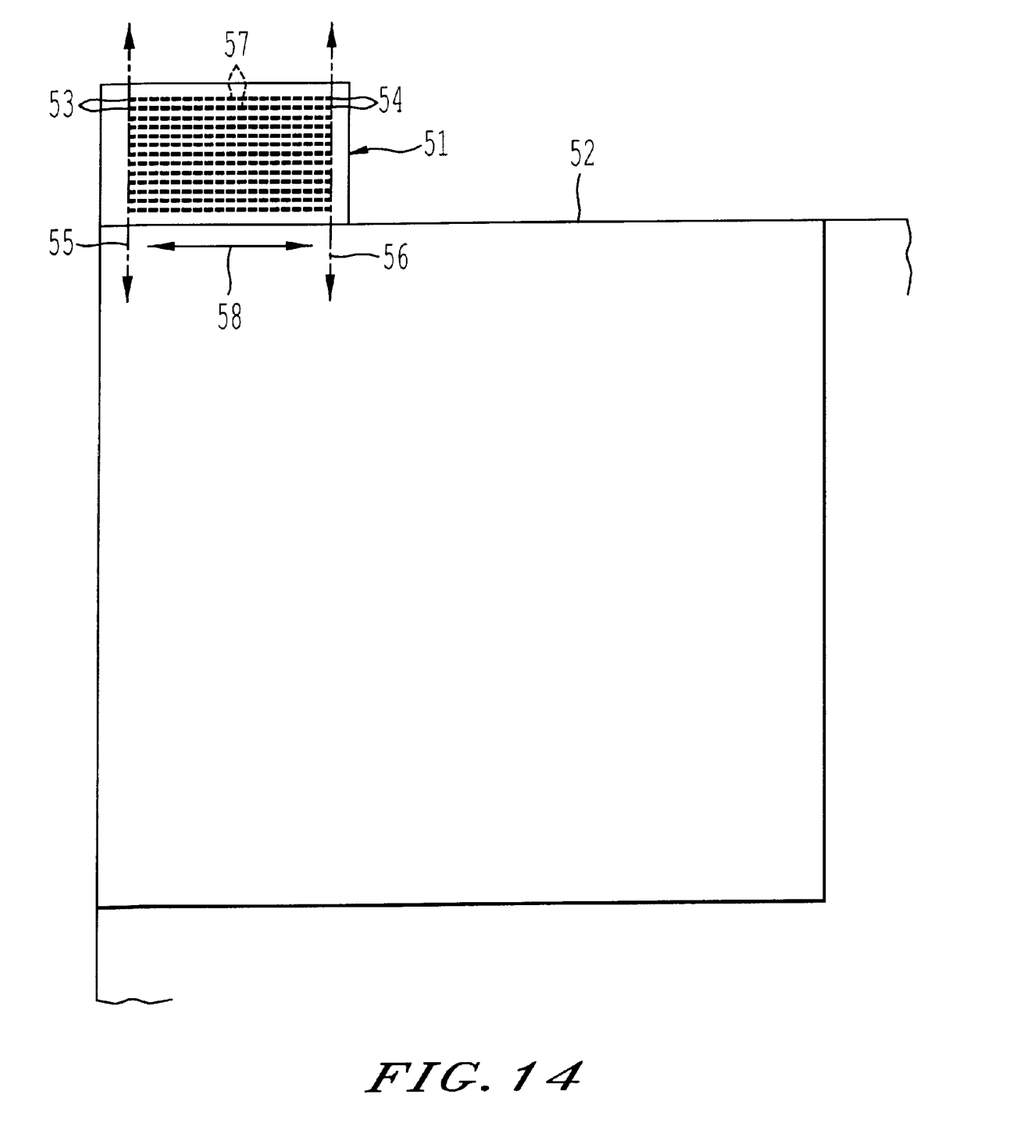
FIG. 14 is a front view showing the printed wiring boards and the test coupon according to the conventional art.

A conventional test coupon 51 in the printed wiring board is, as shown in FIG. 14, provided separably in a protruding condition on an edge of a printed wiring boards 52. A plurality of through holes 53, 54 are formed along both edges of the test coupon 51. Directions 55, 56 of arrays of the through holes 53, 54 are set in parallel to each other and also orthogonal to the edge of the test coupon 51. Between the arrays of the through holes 53, 54, a plurality of conductor patterns 57 each of which extends in a direction orthogonal to the directions of the arrays of the through holes 53, 54 (as indicated by an arrow 58 in FIG. 14) are provided in parallel.

However, in the test coupon in the conventional printed wiring board, the direction 55, 56 of the arrays of the through holes 53, 54 crosses perpendicular to a direction 58 in which the conductor patterns 57 are elongated. Therefore, the test coupon 51 increases in size toward a direction of getting away from the edge of the printed wiring boards 52 in proportion to the number of the through holes 53, 54. Consequently, there arises a problem that a projection length of the test coupon 51 to the printed wiring boards 52 becomes long, and hence the whole of the printed wiring boards 52 and the test coupon 51 becomes large-sized.

SUMMARY OF THE INVENTION

According to one aspect of the invention, a test coupon is configured to be provided in a coupon area defined separately from a wiring board area where multi-layer printed wiring boards are arranged and configured to be used to evaluate characteristics of the multi-layer printed wiring boards which have a tested wiring layer. The test coupon includes a multi-layer substrate forming the coupon area. The multi-layer substrate includes at least first and second wiring layers, first and second through hole groups, a first conductor pattern and a second conductor pattern. The first wiring layer is configured to correspond to the tested wiring layer on which a wiring whose characteristics are to be evaluated is provided. The second wiring layer is configured to correspond to another wiring layer of the multi-layer printed wiring boards. Each of first and second through hole groups has a plurality of through holes which pass through the multi-layer substrate and which are arranged in an arranging direction. A first conductor pattern is provided on the first wiring layer and electrically connecting a first through hole of the first through hole group and a second through hole of the second through hole group. A second conductor pattern is provided on the second wiring layer and electrically connecting a third through hole of the first through hole group and a fourth through hole of the second through hole group. The first and second conductor patterns extend substantially along the arranging direction.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

The preferred embodiments will now be described with reference to the accompanying drawings, wherein like reference numerals designate corresponding or identical elements throughout the various drawings.

Figure 1:
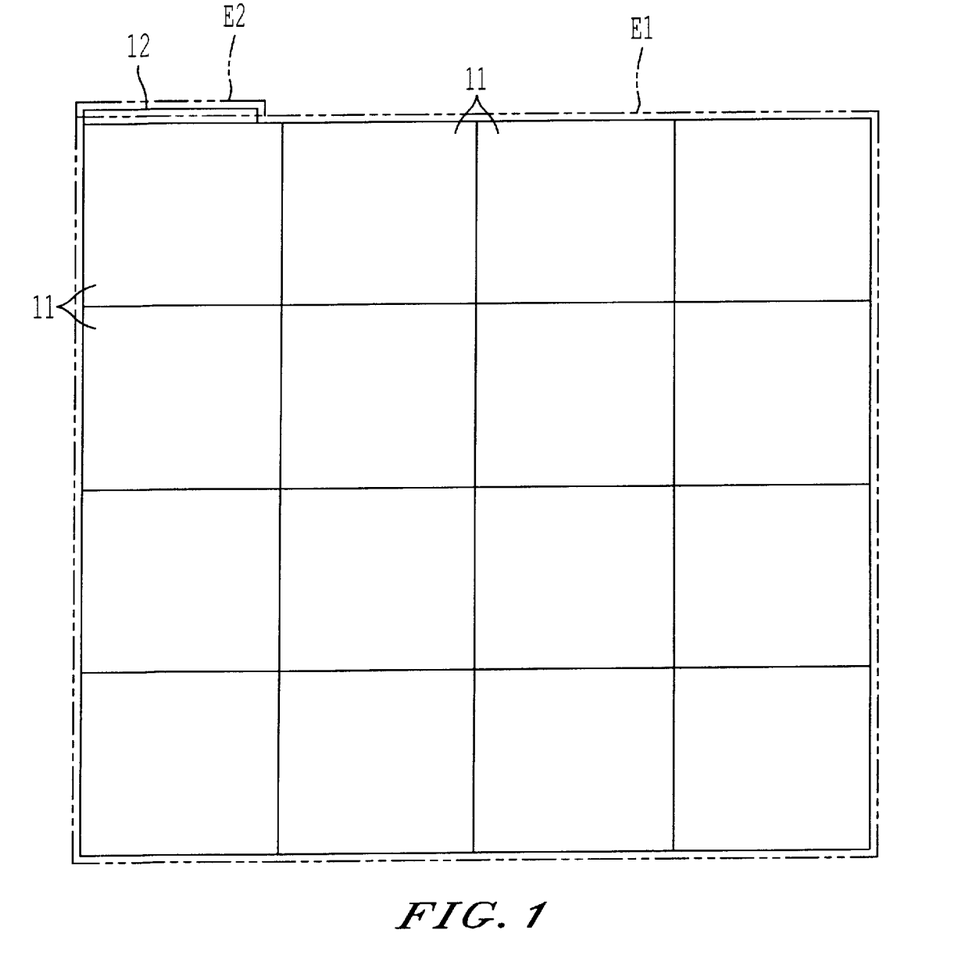
FIG. 1 is a front view showing printed wiring boards and a test coupon.

As shown in FIG. 1, a plurality of printed wiring boards 11 are arranged in a wiring board area E1. In a coupon area E2 that projects from the edge of the wiring board area E1 and that is defined from the wiring board area E1 separately, a test coupon 12 is arranged.

Figure 2:
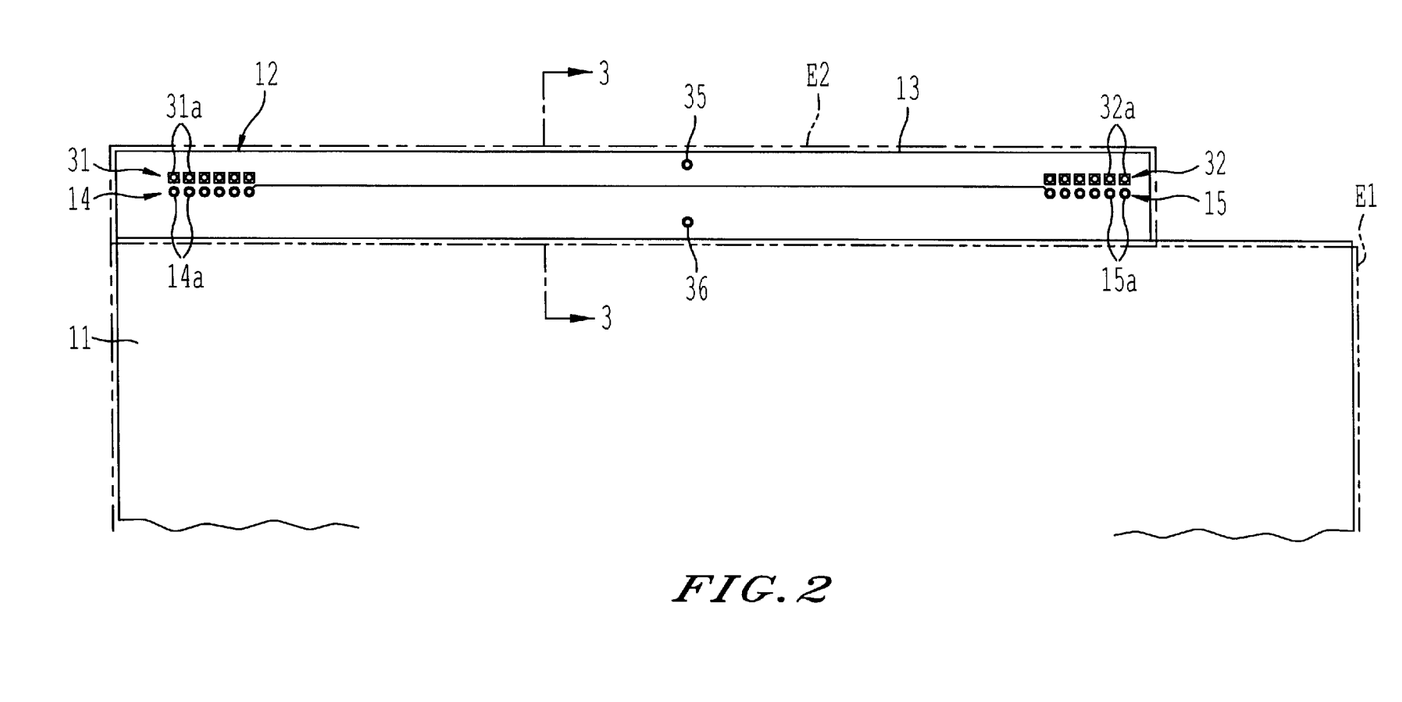
FIG. 2 is a front view showing the enlarged test coupon.

As shown in FIG. 2, a substrate 13 of this test coupon 12 is separably provided to one of the printed wiring boards 11.

The test coupon 12 is formed in the shape of a long and narrow rectangle and is provided in a protruding condition on the edge of the printed wiring board 11. By this arrangement, a single test coupon 12 makes it possible to conduct a test for the electric connection, the nonconductivity, the characteristic impedance and the like at a time, in place of all the printed wiring boards 11.

Figure 3:
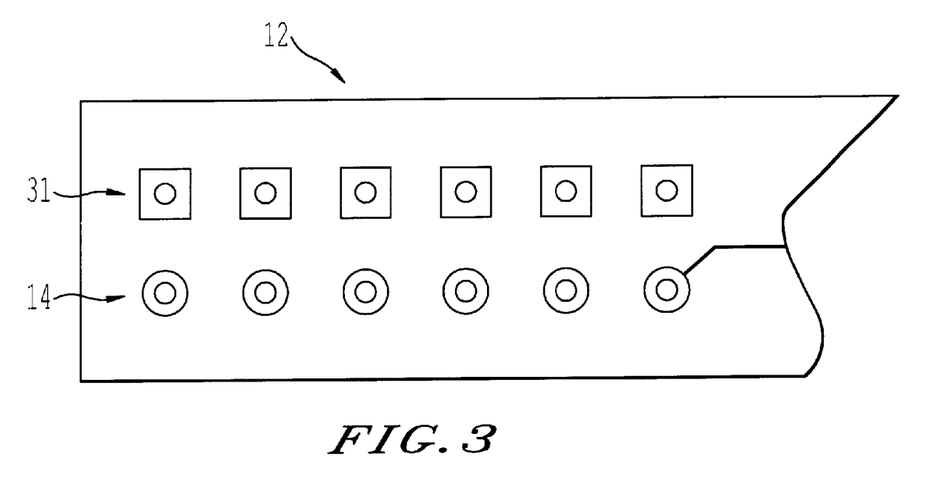
FIG. 3 is a partly enlarged view of FIG. 2.

As shown in FIG. 2 and FIG. 3 which is a partially enlarged view of FIG. 2, a first group of through holes 14, 31 composed of a pair of through holes is formed in an end (at the left side of FIG. 2) of the substrate 13 of the test coupon 12. Further, a second group of through holes 15, 32 composed of a pair of through holes is formed in the other end (at the right side of FIG. 2) of the substrate 13. That is, the first group of through holes 14, 31 and the second group of through holes 15, 32 are arranged at both ends of the coupon area E2.

Each of the first and second groups of through holes 14, 15, 31, 32 is composed of six through holes 14a, 15a, 31a, 32a, respectively. The through holes 14a, 15a, 31a, 32a are arranged side by side along the longitudinal direction of the substrate 13, that is, along the edges of the printed wiring boards 11.

Figure 4:
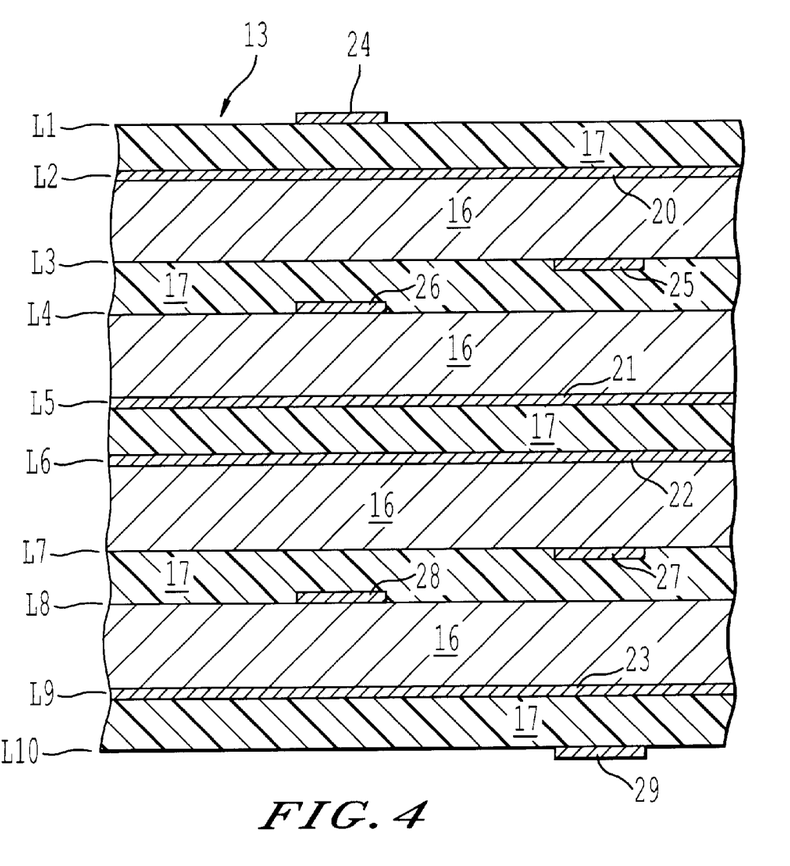
FIG. 4 is a cross-sectional view of FIG. 2 taken along line 3—3.

As shown in FIG. 4, the substrate 13 has a multilayer structure composed of ten layers that are identical to that of the printed wiring boards 11, where a plurality of nonconductive bases 16 and prepregs 17 are laminated alternately. Surfaces of the prepregs 17 of the outermost layers (a first layer L1, a tenth layer L10) are coated with solder resist, which are not shown in the figure. In this embodiment, the first layer L1 of the test coupon 12 refers to a conductor layer formed on the surface of the prepreg 17 of the uppermost part thereof; the second to ninth layers L2 to L9 refer to conductor layers formed between respective prepregs 17 and respective nonconductive bases 16; and the tenth layer L10 refers to a conductor layer formed on the surface of the prepreg 17 of the lowermost part thereof.

Figure 6:
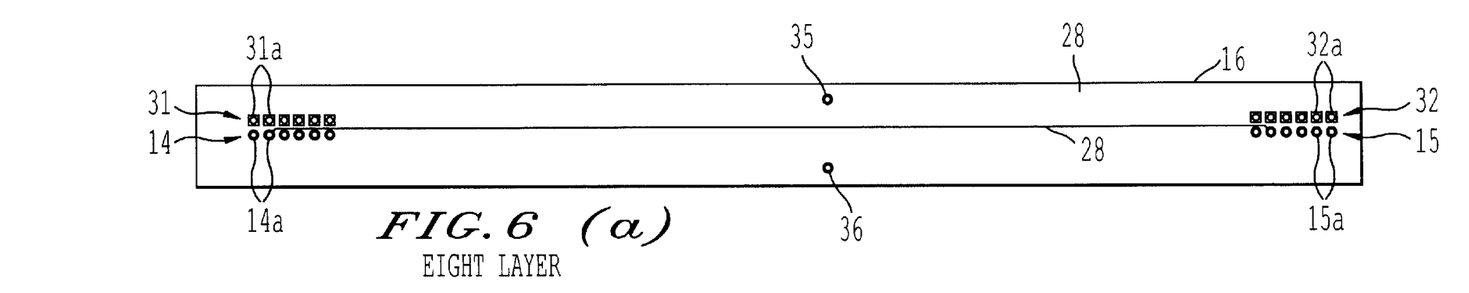
FIG. 6(a) is a front view showing a conductor pattern of the eighth layer.
FIG. 6(b) is a front view showing a conductor of the tenth layer.
FIG. 6(c) is a front view showing conductor patterns of the second, fifth, sixth, and ninth layers.
Figure 7:
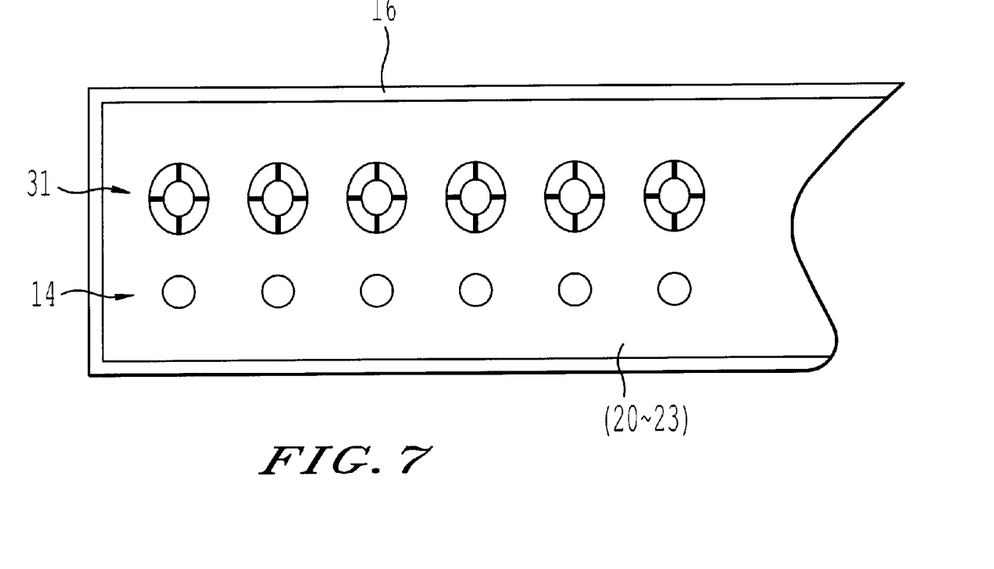
FIG. 7 is a partially enlarged view of FIG. 6(c)

As shown in FIG. 4, FIG. 6(c), and FIG. 7 which is an partially enlarged view of FIG. 6(c), ground layers 20 to 23 are provided as the second layer L2, the fifth layer L5, the sixth layer L6, and the ninth layer L9. These ground layers 20 to 23 are formed in a generally long and narrow rectangle shape so as to cover substantially all over the substrate 13 of the test coupon 12.

Figure 5:
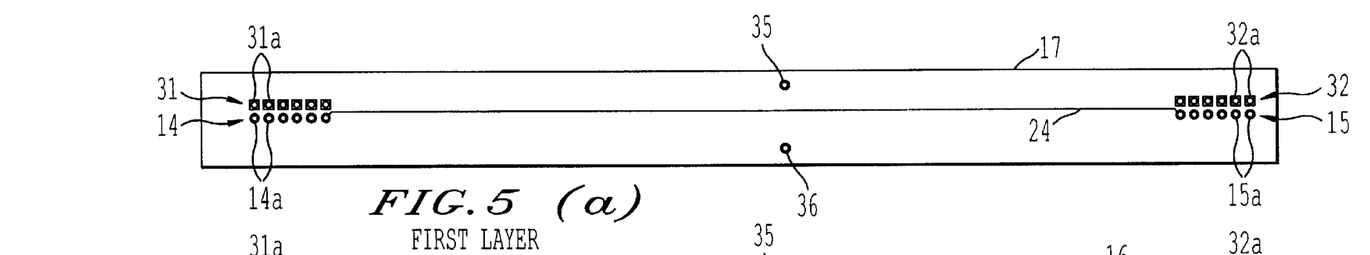
FIG. 5(a) is a front view showing a conductor pattern of the first layer.
FIG. 5(b) is a front view showing a conductor pattern of the third layer.
FIG. 5(c) is a front view showing a conductor pattern of the fourth layer.
FIG. 5(d) is a front view showing a conductor pattern of the seventh layer.

As shown in FIG. 4, FIG. 5 (a) to FIG. 5 (d), FIG. 6 (a), and FIG. 6(b), between the first group of through holes 14, 31 and the second group of through holes 15, 32, a plurality of conductor patterns 24 to 29 are provided in the layers L1, L3, L4, L7, L8, L10, respectively. The conductor patterns 24, 29 of the first layer L1 and the tenth layer L10 are provided on the respective prepregs 17. Further, conductor patterns 25 to 28 of the third layer L3, the forth layer L4, the seventh layer L7, and the eighth layer L8 are provided on the nonconductive bases 16. The conductor patterns 24 to 29 are all of the same length and a major portion of each of these patterns has a shape of a long and narrow straight strip elongated in a longitudinal direction of the substrate 13, only the both ends thereof being bent. The direction of elongation of the conductor patterns 24 to 29 is made to agree with the direction of colinear arrangement of the through holes 14a, 15a, 31a, 32a.

One end of each of the conductor patterns 24 to 29 of respective layers L1, L3, L4, L7, L8, L9 is connected to the through hole 14a of the first group of through holes 14, respectively. The other end of each of the conductor patterns 24 to 29 is connected to the through hole 15a of the second group of through holes 15, respectively.

Further, one end of each of the ground layers 20 to 23 of the respective layers L2, L5, L6, L9 is connected to the through hole 31a of the first group of through holes 31. The other end of each of the ground layers 20 to 23 is connected to the through hole 32a of the second group of through holes 32.

The conductor patterns each of which is located on each of the neighboring nonconductive bases 16, that is, the conductor patterns 25, 26 of the third layer L3 and of the fourth layer L4 are arranged in such positions that both conductor patterns do not overlap each other when viewed in the lamination direction of the nonconductive bases 16. In other words, the conductor patterns 25, 26 are arranged in such positions that both patterns do not face each other in the lamination direction of the nonconductive bases 16 (a vertical direction in FIG. 4). Moreover, as is the case with the conductor patterns 25, 26, the conductor patterns 27, 28 of the seventh layer L7 and of the eighth layer L8 are arranged in such positions that both conductor patterns do not overlap each other when viewed in the lamination direction of the nonconductive bases 16. In other words, the conductor patterns 27, 28 are arranged in such positions that both conductor patterns do not face each other in the lamination direction of the nonconductive bases 16.

In the central part between the first and second groups of through holes 14, 15, 31, 32 on the surface of the substrate 13, there is pierced a pair of marks 35, 36 for indicating a cutting direction when the substrate 13 is cut. Each of the marks 35, 36 has a circular shape and positioned in a width direction of the substrate 13, setting a predetermined distance from each other. Further, the both marks 35, 36 serve as signposts so that the substrate 13 can be cut along an imaginary line connecting these marks when the substrate 13 is inspected and the like. In this embodiment, the marks 35, 36 are through holes.

Next, usage of the test coupon in the printed wiring board that was constituted as mentioned above will be described.

Before separating a plurality of printed wiring boards 11, a test of the printed wiring boards 11 for the characteristic impedance and the like is conducted at a time using the test coupon 12. That is, connection terminals of a test instrument not shown in the figure are connected to the respective through holes 14a, 15a, 31a, 32a of the test coupon 12. Then measurement test of the printed wiring board 11 for the characteristic impedance and the like is conducted. In conducting the measurement of the characteristic impedance, since the conductor patterns 25, 26 of the layers L3, L4 and the conductor patterns 27, 28 of the layers L7, L8 are arranged in such positions that the patterns do not overlap each other when viewed in the lamination direction of the nonconductive bases 16, the characteristic impedance can be measured accurately.

Note that the characteristic impedance depends upon the width and thickness of the conductor patterns 24 to 29. Therefore, in order to inspect the width, thickness and the like of the conductor patterns 24 to 29 of the test coupon 12, it is necessary to cut the substrate 13 of the test coupon 12 correctly.

In this case, at the time of cutting the substrate 13, the substrate 13 is cut along the imaginary line connecting a pair of the marks 35, 36. Thereby, the conductor patterns 24 to 29 are cut in a direction orthogonal to the direction of elongation of the conductor patterns. Therefore, it becomes possible to measure accurately the width and thickness of the conductor patterns 24 to 29.

Figure 8:
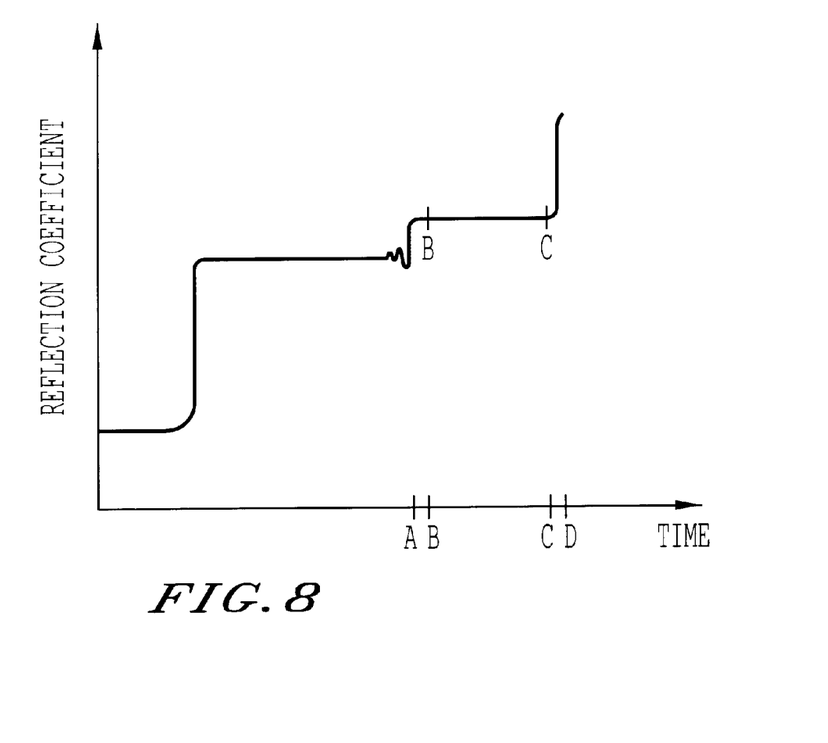
FIG. 8 is a view showing measurement results of the conductor patterns.

Moreover, when the connection terminals of the test instrument not shown in the figure are connected to the conductor patterns 24 to 29 and variation of the reflection coefficient for the conductor patterns 24 to 29 is investigated, the results as shown in FIG. 8 are obtained. According to FIG. 8, a change of the reflection coefficient is large at positions corresponding to the both ends of the 5 conductor patterns 24 to 29 (ranges between A and B and between C and D in FIG. 8), which indicates instability. However, a variation of the refection pattern at portions (range between B and C in FIG. 8) excluding positions of the both ends of the conductor patterns 24 to 29, which indicates relative stability. This is because each of the conductor patterns 24 to 29 has been formed to be the straight strip, excluding the both ends thereof. Therefore, in these portions that exhibit stable reflection coefficients, the characteristic impedance can be measured accurately.

Figure 9:
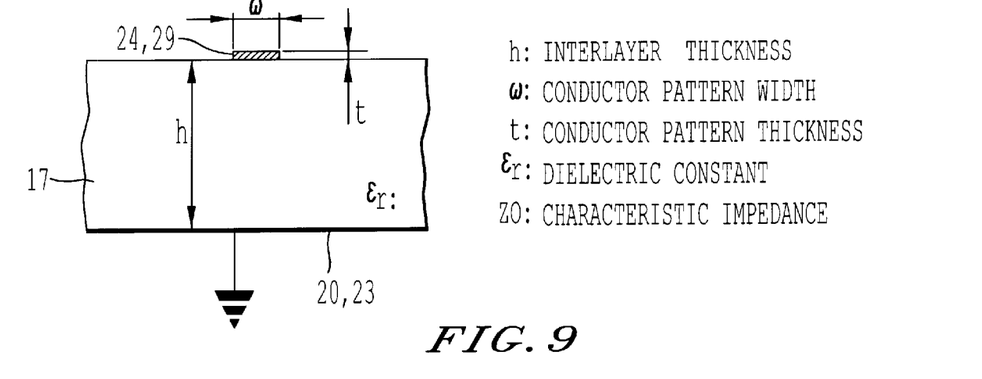
FIG. 9 is a schematic explanatory diagram of a micro strip line.

In addition, it is known that the characteristic impedance can be figured out based on known approximate formulas (1) to (3) for the characteristic impedance besides direct measurement of the characteristic impedance. That is, as shown in FIG. 9, denoting an interlayer thickness as h, the conductor pattern width as ω, the conductor pattern thickness as t, the dielectric constant as ∈, and the characteristic impedance as Z0, the approximate formula for the characteristic impedance of the micro strip line (the conductor patterns 24, 29) is expressed by the following equation (1).

$$Z0 = \frac{60}{\sqrt{\varepsilon_{re}}} Ln \frac{5.97 h}{0.846 \omega + t} \quad (1)$$

Figure 10:
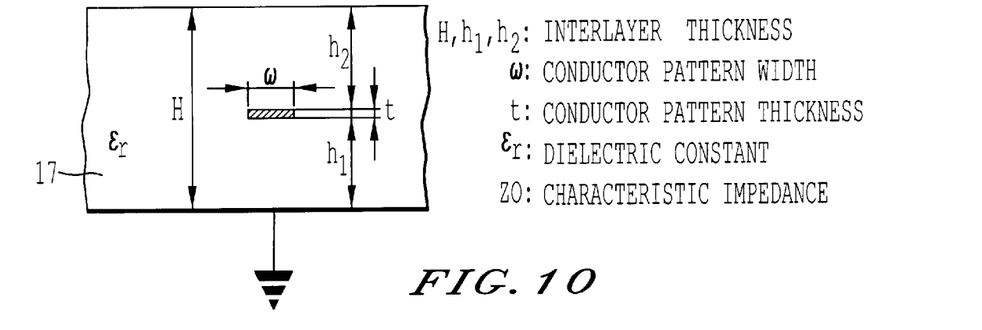
FIG. 10 is a schematic explanatory diagram of a single-side-shielded internal layer line.

$\varepsilon_{re}$: effective relative dielectric constant
$\varepsilon_{re} = 0.475 \, \varepsilon_r + 0.67$ As shown in FIG. 10, denoting the interlayer thicknesses as h1, h2, the conductor pattern width as ω, the conductor pattern thickness as t, the dielectric constant ∈ and the characteristic impedance as Z0, the approximate formula for the characteristic impedance of the single-side-shielded internal layer line is expressed by the following equation (2). Incidentally, a lamination configuration of this type is not shown in the figure.

$$Z0 = \frac{60}{\sqrt{\varepsilon_{re}}} Ln \frac{5.97 h_1}{0.846 \omega + t} \quad (2)$$

Figure 11:
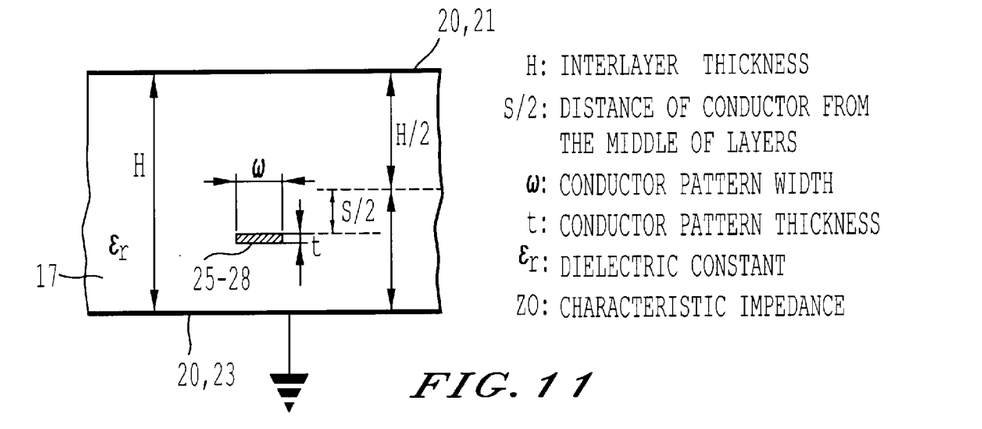
FIG. 11 is a schematic explanatory diagram of a double-side-shielded internal layer line.

$\varepsilon_{re}$: effective relative dielectric constant
$\varepsilon_{re} = 0.475 \, \varepsilon_r + 0.67$ As shown in FIG. 11, denoting the interlayer thicknesses as H, the distance of the conductor from the middle of the layers as S/2, the conductor pattern width as ω, the conductor pattern thickness as t, the dielectric constant ∈ and the characteristic impedance as Z0, an approximate formula for the characteristic impedance of the double-side-shielded internal layer line (the conductor patterns 25, 26, 27, 28) is expressed by the following equation (3).

$$Z0 = \frac{376.7}{\sqrt{\varepsilon_{re} (C1 + C2 + C3)}} \quad (3)$$

$$C1 = \frac{2\omega}{(H - S - t)} + \frac{2\omega}{(H + S - t)}$$

-continued $$C2 = \frac{4(H-S)}{\pi(H-S-t)} Ln \left( \frac{H-S}{H-S-t} + 1 \right) -$$

$$\frac{2}{\pi} \left( \frac{H-S}{H-S-t} - 1 \right) Ln \left( \frac{1}{\left(1 - \frac{1}{H-S}\right)^2} - 1 \right)$$

$$C3 = \frac{4(H+S)}{\pi(H+S-t)} Ln \left( \frac{H+S}{H+S-t} + 1 \right) -$$

$$\frac{2}{\pi} \left( \frac{H+S}{H+S-t} - 1 \right) Ln \left( \frac{1}{\left(1 - \frac{t}{H+S}\right)^2} - 1 \right)$$

$\varepsilon_{re}$: effective relative dielectric constant
$\varepsilon_{re} = 0.475 \, \varepsilon_r + 0.67$ However, the printed wiring boards 11 may vary in their materials, manufacturing methods, and shapes of the conductor patterns 24 to 25 and the like. Therefore, if the characteristic impedance is calculated using the approximation formulas (1) to (3), there is a case where a calculated value differs largely from an actual measurement value. In such a case, it is preferable that the characteristic impedance is compensated based on a compensation formula that is obtained through actual measurement of the conductor patterns with the use of the test coupon according to the present invention that is adjusted to the specifications of the printed wiring board 11.

Therefore, according to this embodiment, the following effects can be obtained.

(1) According to the test coupon 12 of the printed wiring board 11 in this embodiment, the first and second groups of through holes 14, 15, 31, 32 are provided at the both ends of the coupon area E2. Between the first and second groups of through holes 14, 15, the conductor patterns 24 to 29 for electrically connecting the respective through holes 14a, 15a are provided in the form of an elongated strip. The direction of elongation of the conductor patterns 24 to 29 is made to agree with the direction of colinear arrangement of the through holes 14a, 15a, 31a, 32a. By virtue of this arrangement, the test coupon 12 can be provided in a long and narrow shape along the edge of the printed wiring board 11 without increasing the dimensions of the test coupon 12 in proportion to the number of the through holes 53, 54. Therefore, the projection length of the test coupon 12 to the printed wiring board 11 can be reduced and hence the whole of printed wiring boards 11 and the test coupon 12 can be smaller.

(2) According to the test coupon 12 of the printed wiring board 11 in this embodiment, the through holes 14a, 15a, 31a, 32a are arranged side by side in a line parallel to the edge of the printed wiring board 11. By this arrangement, even when the number of the through holes 14a, 15a, 31a, 32a increases, the test coupon can be in an elongated shape along the edge of the printed wiring board 11 with a slightly increased dimension in that direction. Therefore, the projection length of the test coupon 12 to the printed wiring board 11 can be shortened further.

(3) According to the test coupon 12 of the printed wiring board 11 in this embodiment, the conductor patterns 25, 26 of the third layer L3 and the fourth layer L4 are arranged in such positions that the conductor patterns 25, 26 do not overlap each other when viewed in the lamination direction of the nonconductive bases 16. Moreover, the conductor patterns 27, 28 of the seventh layer L7 and the eighth layer L8 are arranged in such positions that the conductor patterns 27, 28 do not overlap each other when viewed in the lamination direction of the nonconductive bases 16. By this arrangement, distances between the conductor patterns 25, 26 and between the conductor patterns 27, 28, each pair of the conductor patterns being adjacent to each other, can be secured sufficiently. Therefore, the characteristic impedance can be measured accurately.

(4) According to the test coupon 12 of the printed wiring board 11 in this embodiment, each of the conductor patterns 24 to 29 is formed to be a straight strip for a major portion thereof and only the both ends thereof are bent. Further, the both ends of the conductor patterns 24 to 29 are electrically connected to the respective through holes 14a, 15a. In other words, a major portion of the conductor patterns 24 to 29 exclusive of the both ends are not bent. Consequently, the reflection coefficients for portions of the conductor patterns 24 to 29, excluding positions corresponding to the both ends can be stabilized. Therefore, the characteristic impedance can be measured much more accurately.

(5) According to the test coupon 12 of the printed wiring board 11 in this embodiment, the marks 35, 36 are formed in the substrate 13 of the test coupon 12. These marks 35, 36 serve as signposts whereby a cutting direction of the substrate 13 can be readily recognized. By this arrangement, it is possible to cut the conductor patterns 24 to 29 accurately in a direction orthogonal to the directions of elongation of the conductor patterns. Therefore, the width and thickness of the conductor patterns 24 to 29 can be measured accurately.

It should be noted that the embodiment of this invention may be altered as follows.

In the embodiment, the invention is put into practice in the form of the single test coupon 12 of the print circuited boards 11 that are intended to provide multiple boards. However, each one of the printed wiring boards 11 may be provided with the test coupon 12, respectively.

The number of the layers of the test coupon 12 may be altered to an arbitrary number.

In the embodiment, the number of the through holes 14a, 31a, 15a, 32a of either of the groups of through holes 14, 15, 31, 32 was set to be six. However, this number may be altered to be any number in the range two to five, or no less than seven.

Figure 12:
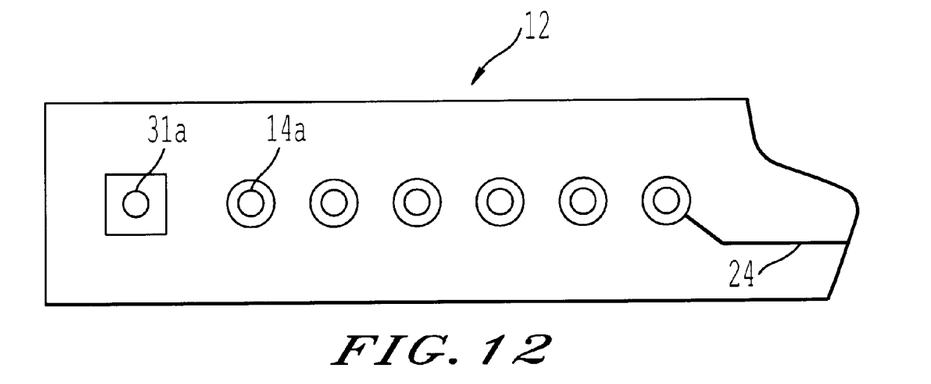
FIG. 12 is a partially enlarged view of the test coupon showing a second embodiment of the present invention.

As the second embodiment of the invention, an enlarged left side view of the test coupon is shown in FIG. 12. This corresponds to FIG. 3 illustrating the test coupon described above. In this example, the first group of through holes 31 is composed of the single through hole 31a, which is arranged in the same line as the first group of through holes 14. Although not shown in the figure, the second group of through holes is in the identical configuration. In this embodiment, the test coupon can be in a more compact form.

Figure 13:
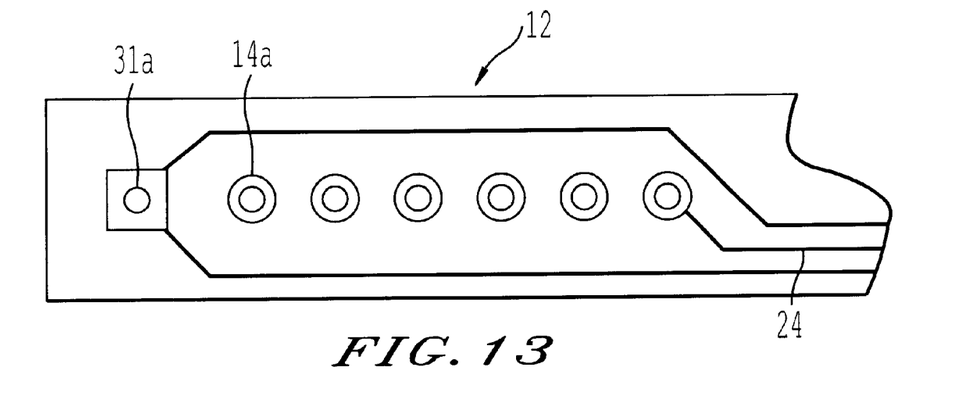
FIG. 13 is a partially enlarged view of the test coupon showing a third embodiment of the present invention.

As the third embodiment of the invention, an enlarged left side view of the test coupon is shown in FIG. 13. This view also corresponds to FIG. 3 illustrating the test coupon described above. In this example, the second embodiment is further improved to provide a test coupon such that the ground patterns are arranged on both sides of the conductor pattern 24. Although not shown in the figure, the second group of through holes is in the identical configuration. In this embodiment, electric characteristics of the conductor pattern 24 itself with reduced external noise can be measured.

According to the first embodiment of the present invention, the projection length of the test coupon to the printed wiring board can be shortened.

According to the second embodiment of the present invention, in addition to the effect by the first embodiment, accurate data can be obtained when conducting the characteristic test of the printed wiring board.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the united states is:

1. A test coupon provided in a coupon area defined separately from a wiring board area where multi-layer printed wiring boards are arranged and configured to be used to evaluate characteristics of the multi-layer printed wiring boards which have a tested wiring layer, the test coupon comprising:

a multi-layer substrate forming the coupon area and having a longitudinal direction, comprising:

at least first and second wiring layers, the first wiring layer being configured to correspond to the tested wiring layer on which a wiring whose characteristics are to be evaluated is provided, the second wiring layer being configured to correspond to another wiring layer of the multi-layer printed wiring boards;

first and second through hole groups each provided on opposite ends in the longitudinal direction of the multi-layer substrate and each having a pluraliity of through holes which pass through the multi-layer substrate and which are arranged in the longitudinal direction;

a first conductor pattern provided on the first wiring layer and electrically connecting a first through hole of the first through hole group and a second through hole of the second through hole group; and a second conductor pattern provided on the second wiring layer and electrically connecting a third through hole of the first through hole group and a fourth through hole of the second through hole group, the first and second conductor patterns extending substantially along the longitudinal direction, a through hole of the first through hole group being connected to only a through hole of the second through hole group via the conductor pattern.

2. A test coupon according to claim 1, wherein the multi-layer substrate further comprises a plurality of nonconductive bases, the conductor patterns are arranged between adjacent nonconductive bases among the plurality of nonconductive bases, each of the conductor patterns has a substantially straight line shape except for both ends of each of the conductor patterns, and adjacent conductor patterns among the conductor patterns are arranged such that the adjacent conductor patterns do not overlap one another when viewed in a lamination direction of the nonconductive bases.

* * * * *